US008693604B2

(12) United States Patent
Hibi (10) Patent No.: US 8,693,604 B2
(45) Date of Patent: Apr. 8, 2014

(54) RECEIVING APPARATUS AND RECEIVING METHOD

(75) Inventor: Michio Hibi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1123 days.

(21) Appl. No.: 12/222,801

(22) Filed: Aug. 15, 2008

(65) Prior Publication Data

US 2009/0141846 A1    Jun. 4, 2009

(30) Foreign Application Priority Data

Dec. 4, 2007    (JP) .................................. 2007-313802

(51) Int. Cl.
*H04L 7/00* (2006.01)

(52) U.S. Cl.
USPC .......................................... 375/355; 375/316

(58) Field of Classification Search
USPC ........................... 375/354, 376, 377, 316, 355
See application file for complete search history.

(56) References Cited

U.S. PATENT DOCUMENTS

| 2005/0069068 | A1 | 3/2005 | Gundurao et al. ............ 375/354 |
| 2005/0259696 | A1 | 11/2005 | Steinman et al. |
| 2006/0109929 | A1 | 5/2006 | Tripathi ........................ 375/272 |
| 2007/0033466 | A1* | 2/2007 | Buchmann et al. ............ 714/731 |
| 2008/0292040 | A1* | 11/2008 | Menolfi et al. ................. 375/376 |

FOREIGN PATENT DOCUMENTS

| JP | 62-278836 | 12/1987 |
| JP | 2000-181591 | 6/2000 |
| JP | 2003-295970 | 10/2003 |
| JP | 2005-018291 | 1/2005 |
| JP | 2005-210653 | 5/2005 |
| JP | 2005-321921 | 11/2005 |
| JP | 2005-332359 | 12/2005 |
| TW | 200640146 | 11/2006 |
| TW | 200708919 | 3/2007 |
| TW | 200723816 | 6/2007 |

OTHER PUBLICATIONS

Japanese Office Action dated Dec. 8, 2009 and issued in corresponding Japanese Patent Application 2007-313802.
Combined Search and Examination Report dated Oct. 23, 2008 in corresponding UK Patent Application No. GB0815791.9 (7 pp).
Taiwan Office Action dated Feb. 17, 2012 issued in corresponding Taiwan Patent Application No. 097131146.

\* cited by examiner

*Primary Examiner* — Chieh M Fan
*Assistant Examiner* — Freshteh N Aghdam
(74) *Attorney, Agent, or Firm* — Staas & Halsey LLP (57) ABSTRACT

A receiving apparatus that can be connected to a transmitting apparatus through a plurality of transmission lines includes: a first clock generation section that generates a first clock based on a signal from a first transmission line which is one of the plurality of transmission lines; a first demodulation section that demodulates the signal from the first transmission line based on the timing of the first clock; a second clock generation section that controls the phase of the first clock based on the phase of a signal from a second transmission line which is one of the plurality of transmission lines and is different from the first transmission line to generate a second clock; and a second demodulation section that demodulates a signal from the second transmission line based on the timing of the second clock.

3 Claims, 12 Drawing Sheets

RECEIVING APPARATUS AND RECEIVING METHOD

BACKGROUND OF THE INVENTION

1. Field of the Invention

The present invention relates to a receiving apparatus that can be connected to a transmitting apparatus through a plurality of transmission lines and its receiving method.

2. Description of the Related Art

A conventional inter-chip transmission system will be described below.

Figure 17:
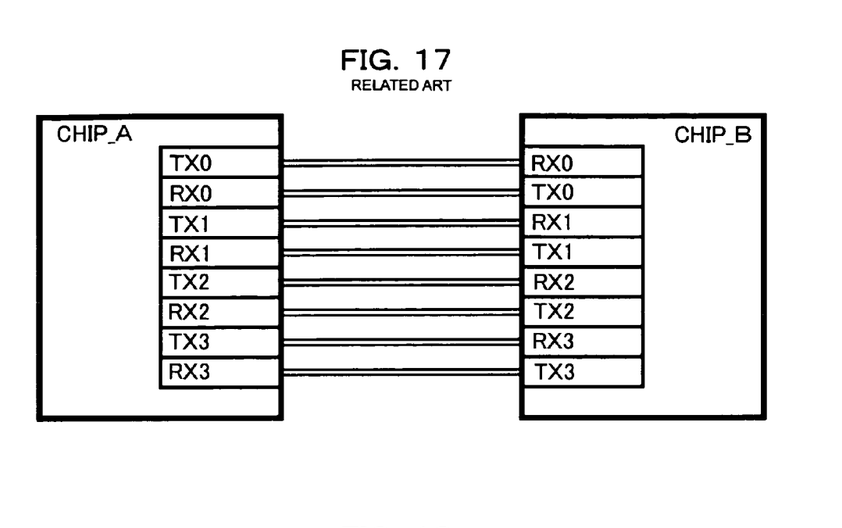
FIG. 17 is a block diagram showing an example of a configuration of bidirectional transmission in a conventional inter-chip transmission system.

FIG. 17 is a block diagram showing an example of a configuration of bidirectional transmission in a conventional inter-chip transmission system, which shows an example of a state of a physical layer in high-speed signal transmission between a chip A (CHIP_A) and chip B (CHIP_B). Each chip has four transmitting circuits (TX0, TX1, TX2, TX3) and four receiving circuits (RX0, RX1, RX2, RX3). In this system, one transmitting circuit and one receiving circuit constitute a pair, and a pair of a transmission line from one transmitting circuit of the chip A to one receiving circuit of the chip B and transmission line from one transmitting circuit of the chip B to one receiving circuit of the chip A is referred to as "lane". Connections of all lanes between the chip A and chip B are referred collectively as "link". That is, the maximum link width between the chip A and chip B is four lanes. Such an inter-chip transmission system is standardized as, e.g., PCI Express.

At power-on time or hard rest time, each chip determines bit synchronization, symbol synchronization, deskew between lanes, link width, lane order, link data rate, before activation of the link. The link width is set to a largest possible value, and data rate is set to a highest possible value. At the activation time, optimization of a transmission waveform or optimization of a reception waveform according to a state of the transmission system is not performed.

Data check is performed in a data link layer and, when a plurality (e.g., three times) of consecutive reception errors take place, it is determined that link abnormality has occurred, and link down is made. A coding method and an error correction method are fixed irrespective of transmission quality of the transmission system.

The above link can assume four states: 0, 0s, 1, and 2. The state 0 is a normal operating state. The state 0s is a state where transmission operation is stopped but CDR and CLK operate. The state 1 is a state where transmission operation is stopped and CDR and CLK are also stopped. The state 2 is a state where transmission operation is stopped and CDR, CLK, and main power supply are stopped.

The states 0s, 1, and 2 are compared with one another. The state 0s has a smaller effect of power reduction and a shorter wake-up time. The state 1 has a moderate effect of power reduction and a moderate wake-up time. The state 2 has a larger effect of power reduction and a longer wake-up time.

An inter-chip transmission system including a transmitting chip and a receiving chip will next be described.

Figure 18:
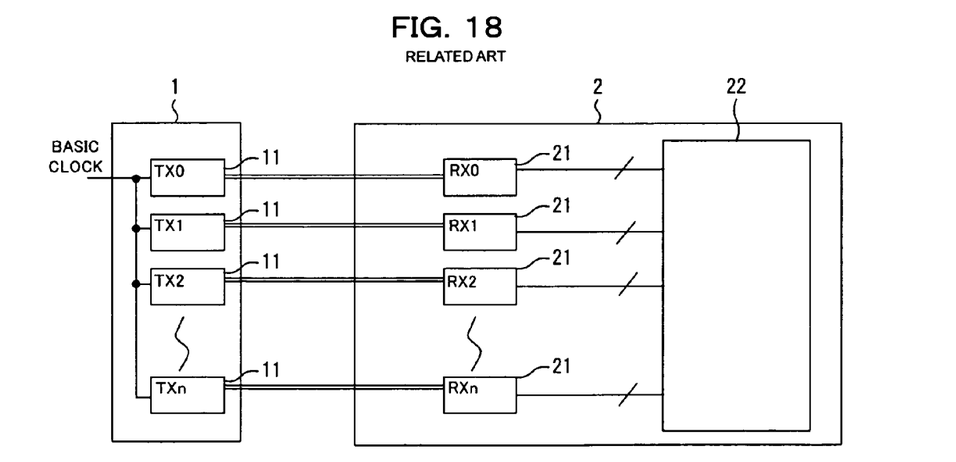
FIG. 18 is a block diagram showing an example of a configuration of one-way transmission in a conventional inter-chip transmission system.

FIG. 18 is a block diagram showing an example of a configuration of one-way transmission in a conventional inter-chip transmission system. The inter-chip transmission system of FIG. 18 includes a transmitting chip 1 and a receiving chip 2. The transmitting chip 1 includes n+1 transmitting circuits 11 (TX0, TX1, ..., Txn). The receiving chip 2 includes n+1 receiving circuits 21 (RX0, RX1, ..., RXn) and a logic circuit 22 in a higher layer.

All the transmitting circuits 11 operate according to an externally supplied common basic clock.

Figure 19:
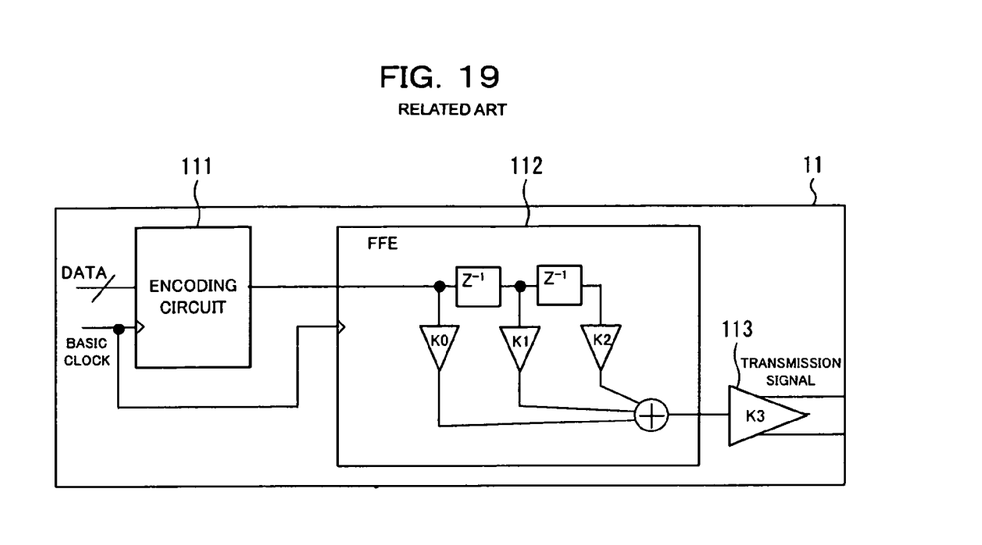
FIG. 19 is a block diagram showing an example of a configuration of a conventional transmitting circuit.

FIG. 19 is a block diagram showing an example of a configuration of a conventional transmitting circuit. The transmitting circuit of FIG. 19 includes an encode circuit 111, an FFE (Feed-Forward Equalization) 112, and an amplifier 113.

When parallel transmission data synchronized with a clock is input to the transmitting circuit, the encode circuit 111 performs 8B/10B coding for the transmission data to shorten the length of consecutive identical digits, embeds a basic clock component in the resultant data, and performs parallel-to-serial conversion, to thereby output a serial signal. The FFE 112 pre-emphasizes a harmonic component of the serial signal. The amplifier 113 in the last stage of the transmitting circuit amplifies the amplitude of the supplied signal to a required amplitude and makes impedance matching between the resultant signal and transmission line to thereby drive the transmission path. The FFE 112 in this example is a three-tap FFE, and the tap coefficients K0 to K2 are set in accordance with the emphasis amount. The gain K3 of the amplifier 113 is set so that the output amplitude has a predetermined value.

Figure 20:
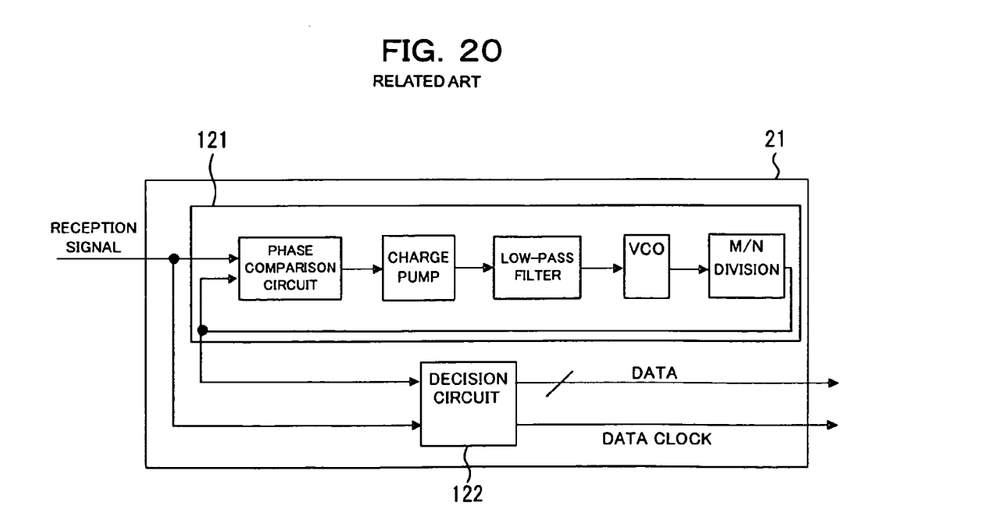
FIG. 20 is a block diagram showing an example of a configuration of a conventional receiving circuit.

FIG. 20 is a block diagram showing an example of a configuration of a conventional receiving circuit. The receiving circuit of FIG. 20 includes a CDR (Clock Data Recovery) 121 and a DECISION circuit 122.

The CDR 121 is constituted by a PLL (Phase Locked Loop) circuit. The PLL circuit is constituted by a phase comparison circuit, a charge pump, a low-pass filter, a VCO, and an M/N division circuit. The PLL circuit compares timing information (edge) of input data and timing information (edge) of VCO (Voltage Controlled Oscillator) output to thereby generate a clock synchronized with input data.

The DECISION circuit 122 determines input data (DATA-IN) transmitted from the transmitting circuit 11 at the timing of a clock output from the CDR 121.

What is required for the PLL circuit is to take in, without fail, the input data with a reasonable take-in time, to keep a locked state with every input data pattern, to have excellent output jitter characteristics, to prevent jitter from increasing in every input data pattern, and to keep a locked state even with data containing consecutive identical digits while preventing output clock jitter from increasing. In high-speed transmission in which the transmission rate exceeds gigabits per second (Gbps), level of the requirements gets higher, so that it is impossible to satisfy the requirements with the abovementioned fundamental configuration.

In order to cope with the above problem, there is proposed a PLL circuit modified such that the output clock jitter of the PLL circuit is not increased even when the transition rate of the input data is low (refer to, e.g., Patent Document 1: Jpn. Pat. Appln. Laid-Open Publication No. 2004-88476). The PLL circuit of Patent Document 1 is about twice the scale of a PLL circuit having a basic configuration.

Further, there is proposed a PLL circuit modified in order to satisfy jitter transfer and jitter tolerance characteristics of the PLL circuit at a specified operating temperature and within a range of power supply voltage (refer to, e.g., Patent Document 2: Jpn. Pat. Appln. Laid-Open Publication No. 2002-359555). A potential generation circuit used in the PLL circuit of Patent Document 2 is created based on a BGR (Band Gap Reference) circuit, so that the scale of this PLL circuit becomes larger than that of a PLL circuit having a basic configuration.

In order to widen the capture range and lock range of the PLL, it is only necessary to widen the PLL loop bandwidth. However, in order to achieve stable operation with a longer consecutive identical digit pattern, the PLL loop needs to be narrowed. In order to realize the opposite requirements, there is proposed a PLL circuit having a loop that locks onto a reference clock and a loop that locks onto input data (refer to, e.g., Patent Document 3: Jpn. Pat. Appln. Laid-Open Publication No. 2005-210540). The PLL circuit of Patent Document 3 requires the reference clock, and the scale thereof becomes larger than that of a PLL circuit having a basic configuration.

As described above, when the performance of the PLL circuit is increased in order to speed up transmission speed, the scale of the circuit is increased, resulting in an increase in power consumption and cost.

SUMMARY OF THE INVENTION

The present invention has been made to solve the above problem, and an object thereof is to provide a receiving apparatus and a receiving method capable of suppressing increase in the circuit scale.

To solve the above problem, according to an aspect of the present invention, there is provided a receiving apparatus that can be connected to a transmitting apparatus through a plurality of transmission lines, including: a first clock generation section that generates a first clock based on a signal from a first transmission line which is one of the plurality of transmission lines; a first demodulation section that demodulates the signal from the first transmission line based on the timing of the first clock; a second clock generation section that controls the phase of the first clock based on the phase of a signal from a second transmission line which is one of the plurality of transmission lines and is different from the first transmission line to generate a second clock; and a second demodulation section that demodulates a signal from the second transmission line based on the timing of the second clock.

Further, according to another aspect of the present invention, there is provided a receiving method by which a receiving apparatus connected to a transmitting apparatus through a plurality of transmission lines receives a signal from the plurality of transmission lines, including: generating a first clock based on a signal from a first transmission line which is one of the plurality of transmission lines; demodulating the signal from the first transmission line based on the timing of the first clock; controlling the phase of the first clock based on the phase of a signal from a second transmission line which is one of the plurality of transmission lines and is different from the first transmission line to generate a second clock; and demodulating a signal from the second transmission line based on the timing of the second clock.

According to the present invention, it is possible to suppress increase in the scale of a circuit for data reception in an inter-chip transmission system.

DETAILED DESCRIPTION OF THE PREFERRED EMBODIMENTS

Embodiments of the present invention will be described below with reference to the accompanying drawings.

First Embodiment

A configuration of an inter-chip transmission system according to a first embodiment will first be described.

Figure 1:
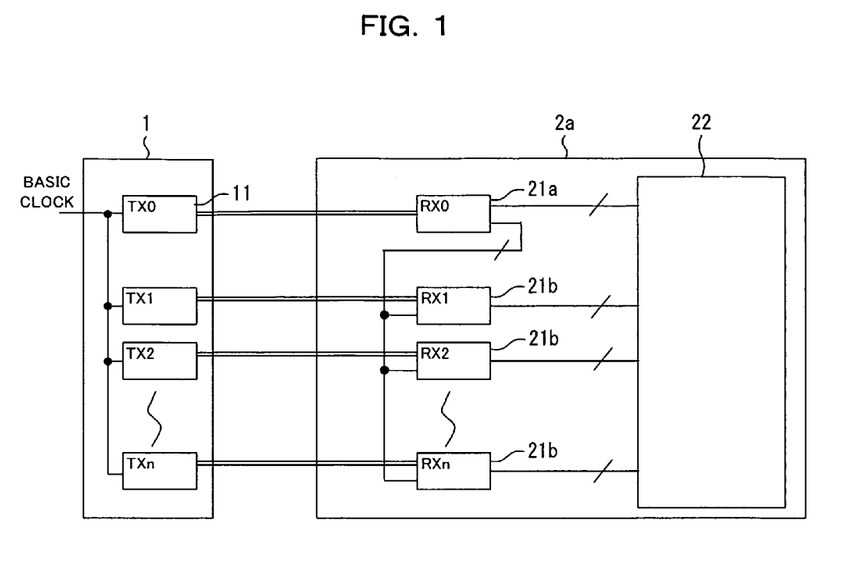
FIG. 1 is a block diagram showing an example of a configuration of an inter-chip transmission system according to a first embodiment.

FIG. 1 is a block diagram showing an example of a configuration of an inter-chip transmission system according to the present embodiment. In FIG. 1, the same reference numerals as those in FIG. 18 denote the same or corresponding parts as those in FIG. 18, and the descriptions thereof will be omitted here. Compared with FIG. 18, the inter-chip transmission system of FIG. 1 includes a receiving chip 2a (receiving apparatus) in place of the receiving chip 2. Compared with the receiving chip 2, the receiving chip 2a includes, in place of the n+1 receiving circuits 21, one receiving circuit 21a (RX0) and n receiving circuits 21b (RX1, RX2, ..., RXn).

Figure 2:
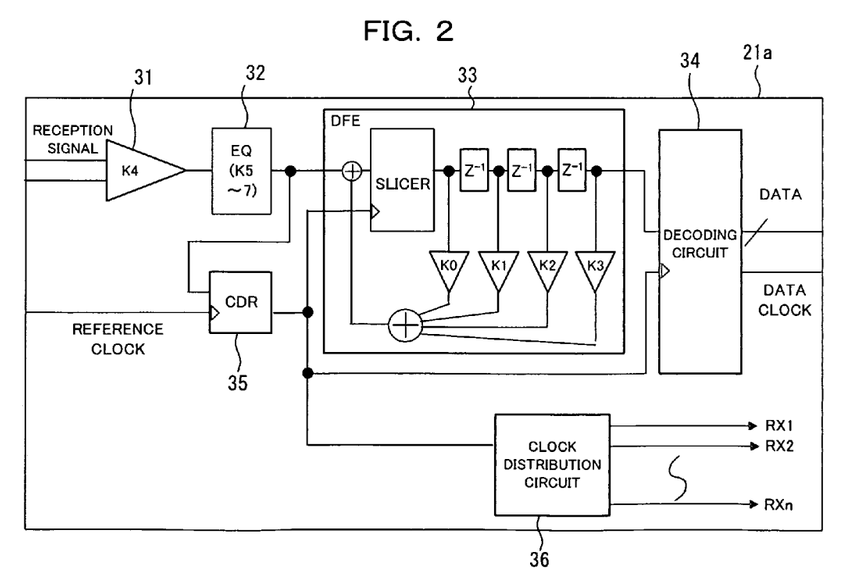
FIG. 2 is a block diagram showing an example of a configuration of a receiving circuit 21a according to the first embodiment.

FIG. 2 is a block diagram showing an example of a configuration of the receiving circuit 21a according to the present embodiment. The receiving circuit 21a of FIG. 2 includes an amplifier 31, an EQ (Equalizer) 32, a DFE (Decision Feedback Equalizer) 33, a decoding circuit 34, a CDR 35, a clock distribution circuit 36.

A reception signal which is a received transmission waveform is terminated in a matched impedance level by the amplifier 31 in the first stage to be amplified. The gain K4 of the amplifier 31 is set so that the amplitude of the reception signal has a required value. The equalizer coefficients K5 to K7 of the EQ32 are set so that the reception signal has required equalization characteristics (frequency characteristics).

Figure 3:
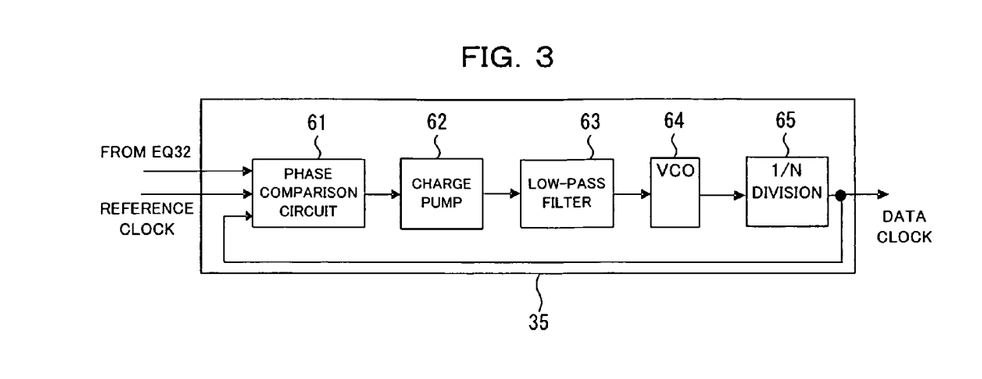
FIG. 3 is a block diagram showing an example of a configuration of a CDR according to the first embodiment.

FIG. 3 is a block diagram showing an example of a configuration of a CDR according to the present embodiment. The CDR 35 is constituted by a PLL circuit. The PLL circuit includes a phase comparison circuit 61, a charge pump 62, a low-pass filter 63, a VCO 64, and a 1/N division circuit 65. The CDR 35 reproduces a basic clock component from the reception signal (DATA) and outputs the reproduced basic clock component as a data clock. The CDR 35 receives a reference clock (REF-CLK) from an external device to enable multirate transmission of a signal by which operation speed without a reception signal and rising speed at the reception start time can be increased. The data clock output from the CDR 35 is input to a SLICER of the DFE 33, the decoding circuit 34, and the clock distribution circuit 36.

The DEF 33 is an equalizer that uses a digital filter and has a SLICER and four taps. The DEF 33 makes the frequency characteristics flat without amplifying noise or crosstalk. The DEF 33 ensures a voltage margin of the SLICER in the DFE 33 even when receiving consecutive identical digits to suppress pattern dependant jitter. The SLICER uses the data clock to perform data determination of a signal obtained by synthesizing the input data and a signal that has returned thereto through the four taps.

The decoding circuit 34 converts a high-speed serial signal into a parallel signal and performs decoding such as 8B/10B scheme.

The clock distribution circuit 36 distributes the data clock output from the CDR 35 to the n receiving circuits 21b (RX1 to RXn).

Figure 4:
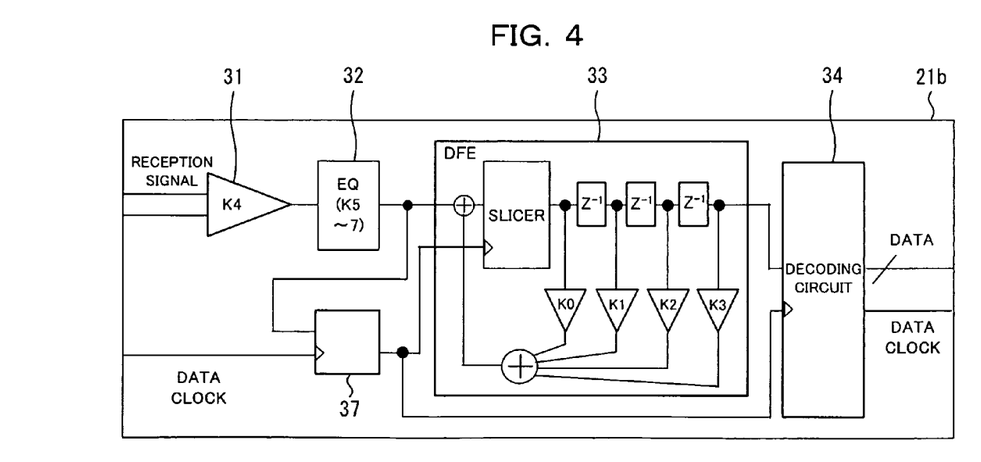
FIG. 4 is a block diagram showing an example of a configuration of a receiving circuit 21b according to the first embodiment.

FIG. 4 is a block diagram showing an example of a configuration of the receiving circuit 21b according to the present embodiment. In FIG. 4, the same reference numerals as those in FIG. 2 denote the same or corresponding parts as those in FIG. 2, and the descriptions thereof will be omitted here. Compared with the receiving circuit 21a of FIG. 2, the receiving circuit 21b includes a phase control circuit 37 in place of the CDR 35.

The phase control circuit 37 controls the phase of the data clock output from the CDR 35 of the receiving circuit 21a to an optimum phase for the its own reception signal. The data clock output from the phase control circuit 37 is input to the SLICER of the DFE 33 and the decoding circuit 34.

Figure 5:
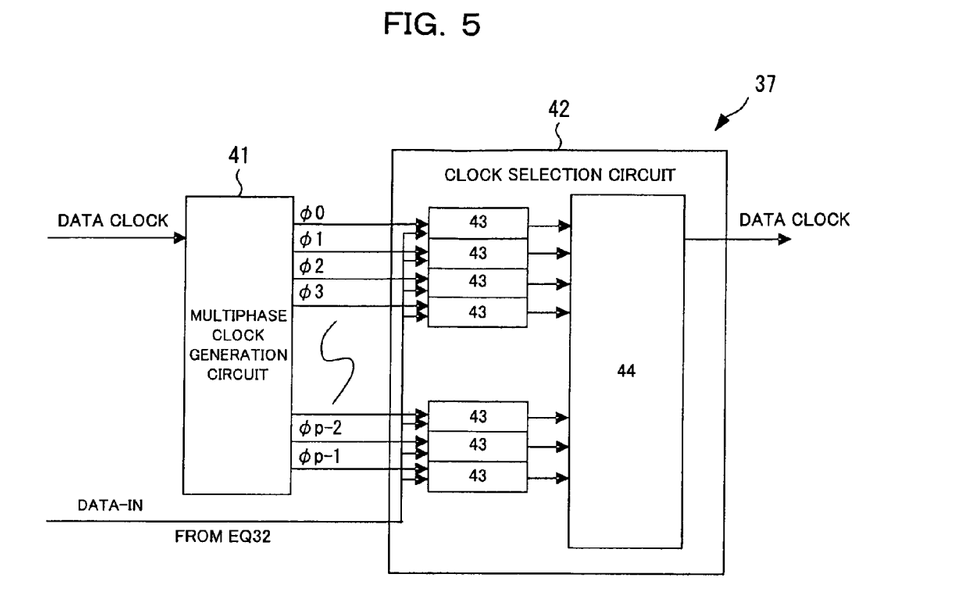
FIG. 5 is a block diagram showing an example of a configuration of a phase control circuit according to the first embodiment.

FIG. 5 is a block diagram showing an example of a configuration of the phase control circuit according to the present embodiment. The phase control circuit 37 of FIG. 5 includes a multiphase clock generation circuit 41 and a clock selection circuit 42.

Figure 6:
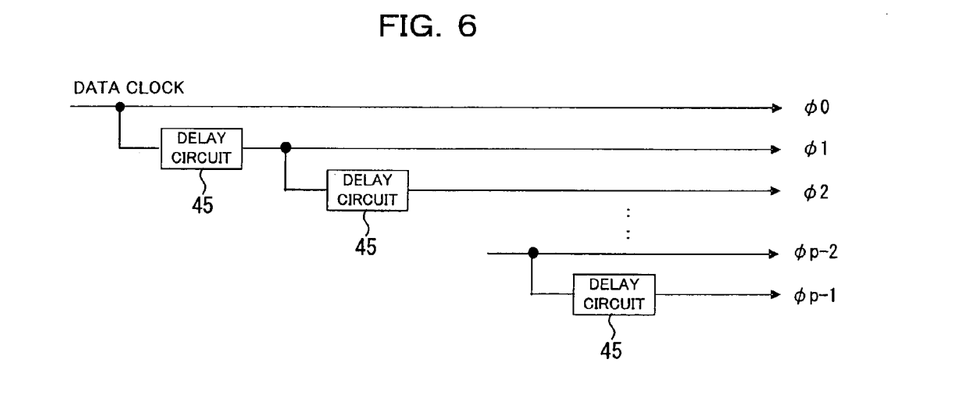
FIG. 6 is a block diagram showing an example of a configuration of a multiphase clock circuit according to the first embodiment.

The multiphase clock generation circuit 41 outputs, based on the data clock output from the CDR 35 of the receiving circuit 21a, p clocks ($\phi 0$, $\phi 1$, ..., $\phi p-1$) having different phases. FIG. 6 is a block diagram showing an example of a configuration of the multiphase clock circuit according to the present embodiment. The multiphase clock generation circuit 41 has p-1 identical delay circuits 45. After an input clock passes through i delay circuits, the data clock $\phi i$ (i=0, 1, ..., p-1) is output from the multiphase clock generation circuit 41.

The clock selection circuit 42 includes p phase comparison circuits 43 and a determination circuit 44. The phase comparison circuit 43 compares the phases of the data clock $\phi i$ output from the multiphase clock generation circuit 41 and input data (DATA-IN) and outputs, as a comparison result, one of "advanced phase" (the phase of the data clock $\phi i$ is advanced with respect to the phase of the input data), "coincidence" (the phase of the data clock $\phi i$ coincides with the phase of the input data), and "delayed phase" (the phase of the data clock $\phi i$ is delayed with respect to the phase of the input data). The determination circuit 44 selects, from the p data clocks output from the multiphase clock generation circuit 41, a clock whose phase coincides with the phase of the input data based on the comparison results of the p phase comparison circuits 43 and outputs the selected clock.

Figure 7:
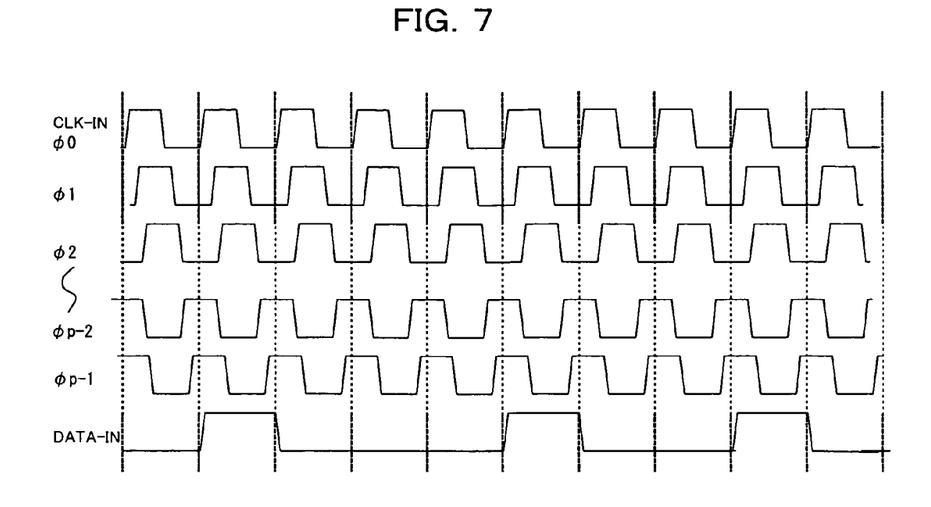
FIG. 7 is a timing chart showing an example of outputs of the multiphase clock circuit according to the first embodiment.

FIG. 7 is a timing chart showing an example of outputs of the multiphase clock circuit according to the present embodiment. Waveforms of the input clock (CLK_IN) and data clock $\phi 0$, $\phi 1$, ... $\phi p-2$, $\phi p-1$, input data (DATA-IN) are shown from the top to the bottom. In this example, the phases of the data clock $\phi 0$ and input data coincide with each other, so that the selection circuit 42 selects and outputs the data clock $\phi 0$.

According to the present embodiment, the scale of the phase control circuit 37 provided in the receiving circuit 21b is smaller than that of the CDR 35 provided in the receiving circuit 21a. That is, it is only necessary for the receiving chip 2a to have only one receiving circuit 21a having the CDR 35 whose circuit scale is large, enabling high-quality data transmission while suppressing increase in the circuit scale of the receiving chip and chip size. As a result, it is possible to perform high-speed data transmission while suppressing power consumption of the receiving chip.

Second Embodiment

A configuration of an inter-chip transmission system according to a second embodiment will first be described.

Figure 8:
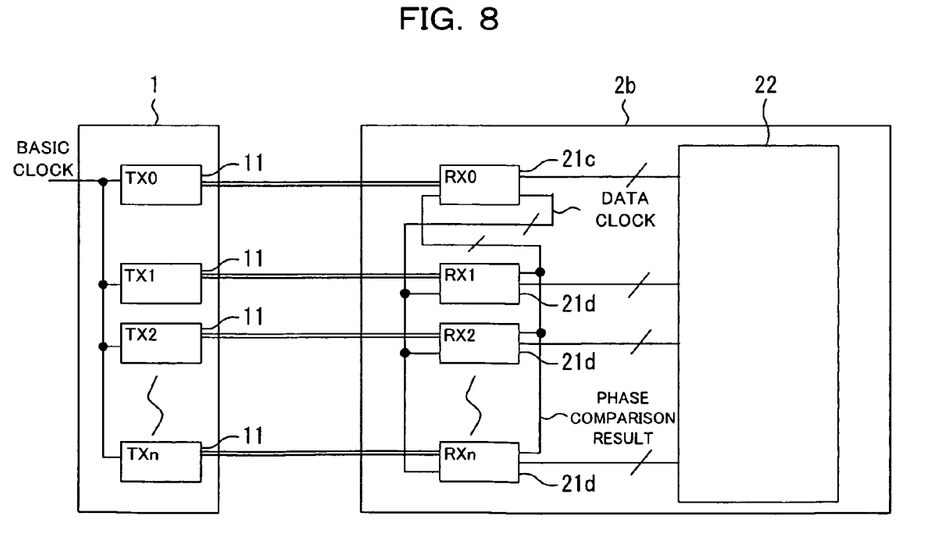
FIG. 8 is a block diagram showing an example of a configuration of an inter-chip transmission system according to a second embodiment.

FIG. 8 is a block diagram showing an example of a configuration of an inter-chip transmission system according to the present embodiment. In FIG. 8, the same reference numerals as those in FIG. 1 denote the same or corresponding parts as those in FIG. 1, and the descriptions thereof will be omitted here. Compared with FIG. 1, the inter-chip transmission system of FIG. 8 includes a receiving chip 2b (receiving apparatus) in place of the receiving chip 2a. Compared with the receiving chip 2a, the receiving chip 2b includes a receiving circuit 21c (RX0) in place of the receiving circuit 21a and receiving circuits 21d (RX1, RX2, ..., RXn) in place of the receiving circuits 21b.

Figure 9:
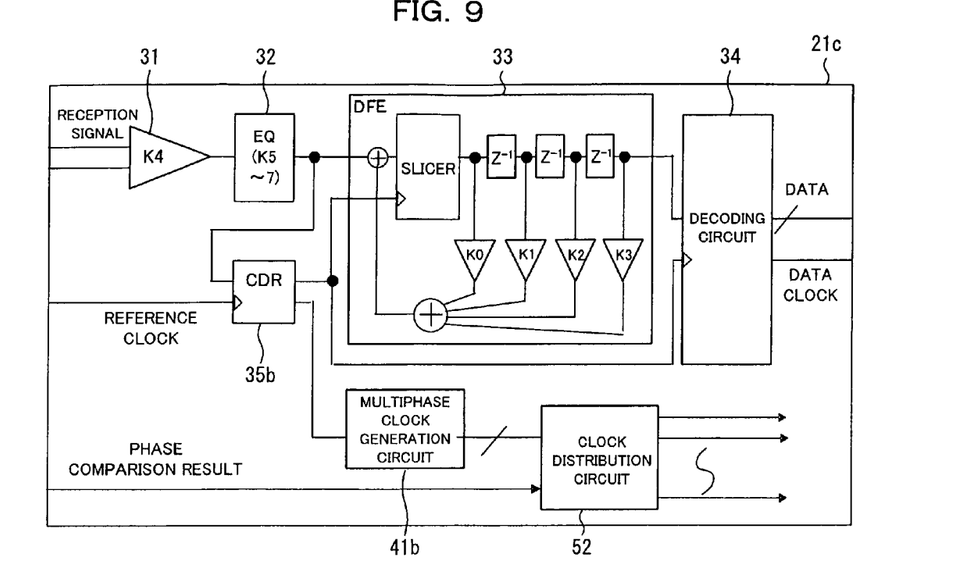
FIG. 9 is a block diagram showing an example of a configuration of a receiving circuit 21c according to the second embodiment.

FIG. 9 is a block diagram showing an example of a configuration of the receiving circuit 21c according to the present embodiment. In FIG. 9, the same reference numerals as those in FIG. 2 denote the same or corresponding parts as those in FIG. 2, and the descriptions thereof will be omitted here. Compared with the receiving circuit 21a of FIG. 2, the receiving circuit 21c includes a CDR 35b in place of the CDR 35 and a multiphase clock generation circuit 41b and a clock distribution circuit 52 in place of the clock distribution circuit 36.

Figure 10:
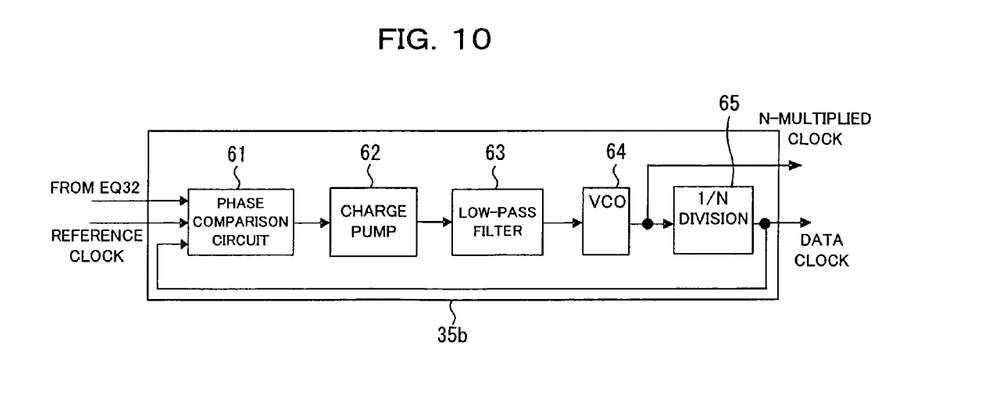
FIG. 10 is a block diagram showing an example of a configuration of a CDR according to the second embodiment.

FIG. 10 is a block diagram showing an example of a configuration of the CDR according to the present embodiment. In FIG. 10, the same reference numerals as those in FIG. 3 denote the same or corresponding parts as those in FIG. 3, and the descriptions thereof will be omitted here. The CDR 35b outputs, in addition to the data clock, a N-multiplied clock which a N-multiplied clock of the data clock that has not been subjected to 1/N frequency division.

The multiphase clock generation circuit 41b generates p data clocks $\Psi 0$, $\Psi 1$, ..., $\Psi p-1$ having different phases based on the N-multiplied clock from the CDR 35b.

Assuming that one of the n receiving circuits 21d is RXj (j=1, 2, ..., n), the clock distribution circuit 52 selects one data clock from the p data clocks output from the multiphase clock generation circuit 41b according to a phase comparison result output from the RXj and supplies the selected data clock to the RXj.

In this example, the phase comparison result indicates one of "advanced phase", "coincidence", and "delayed phase". In the case where the comparison result received from the RXj is "advanced phase", the clock distribution circuit 52 supplies a data clock obtained by delaying the current data clock by half a clock cycle to the RXj. In the case where the comparison result received from the RXj is "delayed phase", the clock distribution circuit 52 supplies a data clock obtained by advancing the current data clock by half a clock cycle to the RXj. In the case where the comparison result received from the RXj is "coincidence", the clock distribution circuit 52 supplies the current data clock to the RXj without modification.

Figure 11:
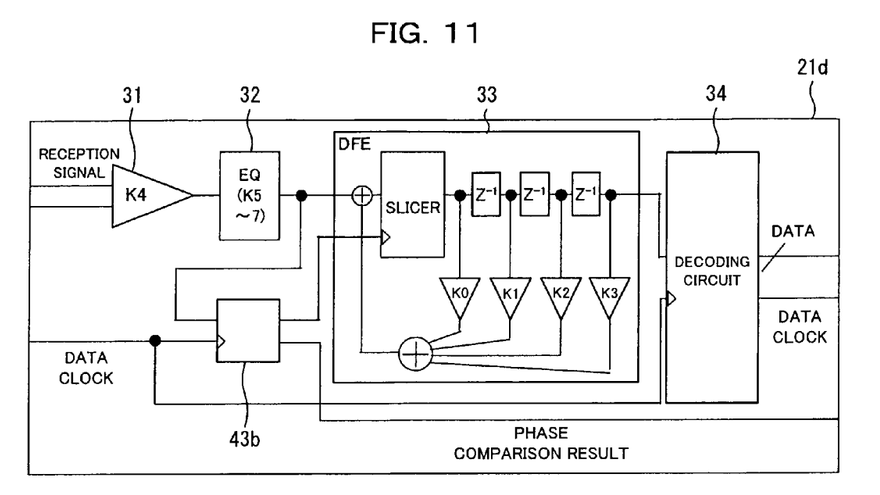
FIG. 11 is a block diagram showing an example of a configuration of a receiving circuit 21d according to the second embodiment.

FIG. 11 is a block diagram showing an example of a configuration of the receiving circuit 21d according to the present embodiment. In FIG. 11, the same reference numerals as those in FIG. 4 denote the same or corresponding parts as those in FIG. 4, and the descriptions thereof will be omitted here. Compared with the receiving circuit 21b of FIG. 4, the receiving circuit 21d includes a phase comparison circuit 43b in place of the phase control circuit 37. The phase comparison circuit 43b compares the phases of the data clock $\Psi i$ output from the multiphase clock generation circuit 41b and input data (DATA-IN) and outputs, as a comparison result, one of "advanced phase", "coincidence", and "delayed phase" to the clock distribution circuit 52 of the receiving circuit 21c.

An example of the data clock will next be described.

Figure 12:
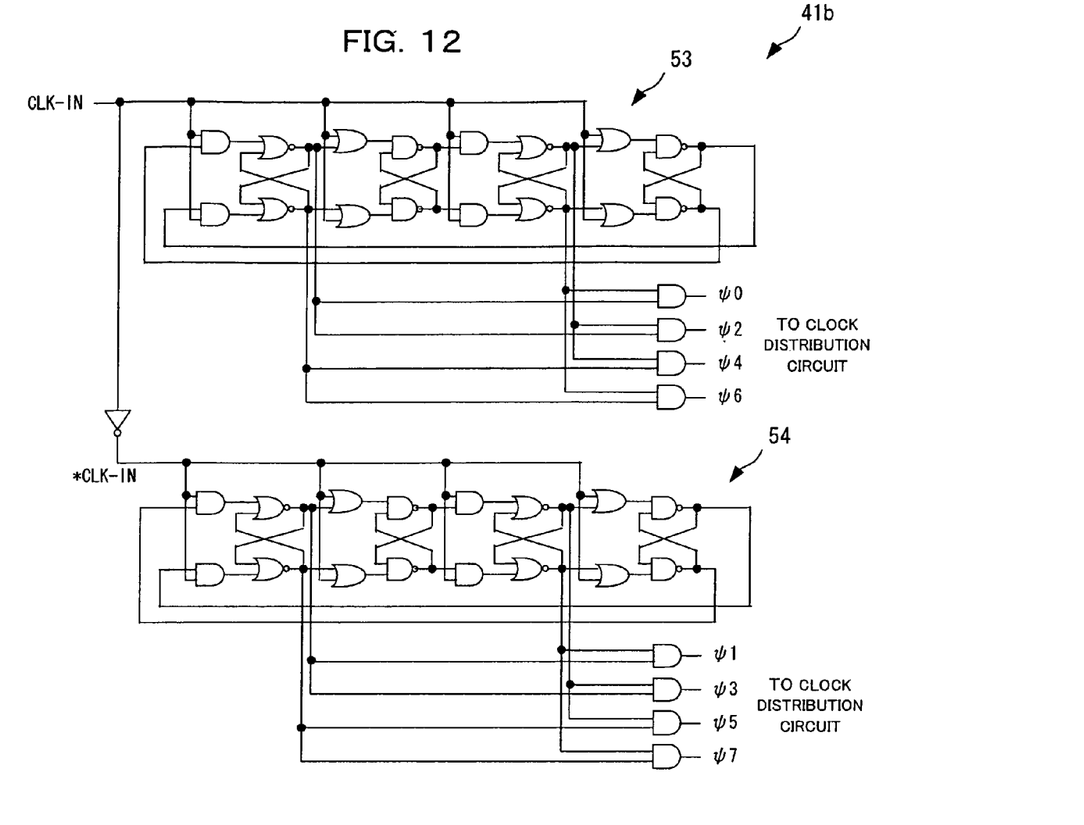
FIG. 12 is a block diagram showing an example of a configuration of a multiphase clock generation circuit according to the second embodiment.

FIG. 12 is a block diagram showing an example of a configuration of the multiphase clock generation circuit according to the present embodiment. It is assumed in this example that p=8 and that eight data clocks output from the multiphase clock generation circuit 41b are $\Psi 0, \Psi 1, \ldots, \Psi 7$. The multiphase clock generation circuit 41b includes a first clock generation section 53 for generating $\Psi 0, \Psi 2, \Psi 4$, and $\Psi 6$ from the N-multiplied clock (CLK_IN) and a second clock generation section 54 for generating $\Psi 1, \Psi 3, \Psi 5$, and $\Psi 7$ from the N-multiplied clock.

Figure 13:
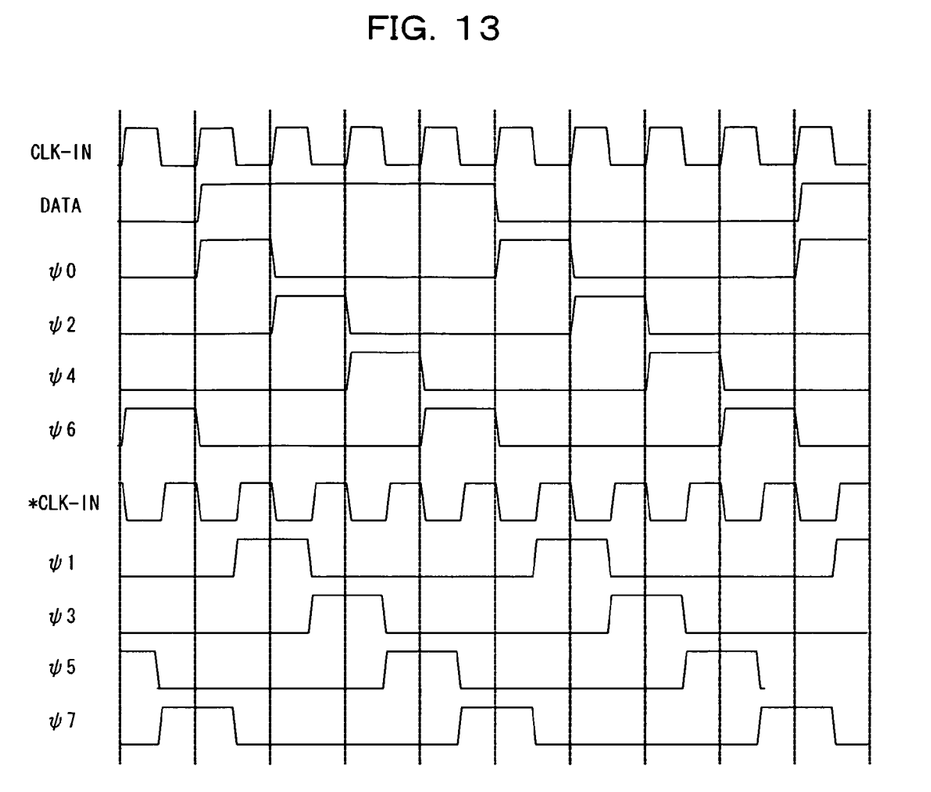
FIG. 13 is a timing chart showing an example of data clocks generated by the multiphase clock generation circuit according to the second embodiment.

FIG. 13 is a timing chart showing an example of data clocks generated by the multiphase clock generation circuit according to the present embodiment. Waveforms of the CLK_IN, input data (DATA-IN) to the RXj in the receiving circuit 21d, data clock $\Psi 0, \Psi 2, \Psi 4, \Psi 6$, *CLK_IN obtained by inverting the CLK_IN, data clock $\Psi 1, \Psi 3, 5, \Psi 7$ are shown from the top to the bottom.

As shown in FIG. 13, the first clock generation circuit 53 generates the data clocks $\Psi 0, \Psi 2, \Psi 4, \Psi 6$ which are shifted from each other by one clock cycle of the CLK_IN. The second clock generation circuit 54 generates the *CLK_IN from the CLK_IN and generates the data clocks $\Psi 1, \Psi 3, \Psi 5, \Psi 7$ which are shifted from each other by one clock cycle of the *CLK_IN. As a result, the data clocks $\Psi 0, \Psi 1, \ldots, \Psi 7$ are shifted from each other by half a clock cycle of the CLK_IN.

Assuming that RXj performs data determination of the DATA-IN at the rising edge of the data clock, the data clock $\Psi 4$ is appropriate. Thus, in the case where the data clock from the receiving circuit 21c is $\Psi 4$, the phase comparison circuit 43 of the RXj transmits, to the receiving circuit 21c, a result indicating "coincidence", and the receiving circuit 21c transmits $\Psi 4$ to the RXj ongoingly. In the case where the data clock from the receiving circuit 21c is $\Psi 3$, the phase comparison circuit 43 of the RXj transmits, to the receiving circuit 21c, a result indicating "advanced phase", and the receiving circuit 21c delays $\Psi 3$ by half a clock cycle of the N-multiplied clock to obtain $\Psi 4$ and transmits $\Psi 4$ to the RXj. In the case where the data clock from the receiving circuit 21c is $\Psi 5$, the phase comparison circuit 43 of the RXj transmits, to the receiving circuit 21c, a result indicating "delayed phase", and the receiving circuit 21c advances $\Psi 5$ by half a clock cycle of the N-multiplied clock to obtain $\Psi 4$ and transmits $\Psi 4$ to the RXj.

According to the present embodiment, the scale of the phase comparison circuit 43 provided in the receiving circuit 21d is smaller than that of the CDR 35b provided in the receiving circuit 21c. That is, it is only necessary for the receiving chip 2a to have only the receiving circuit 21a having the CDR 35 whose circuit scale is large, enabling high-quality data transmission while suppressing increase in the circuit scale of the receiving chip. As a result, it is possible to perform high-speed data transmission while suppressing power consumption of the receiving chip.

Third Embodiment

A configuration of an inter-chip transmission system according to a third embodiment will first be described.

Figure 14:
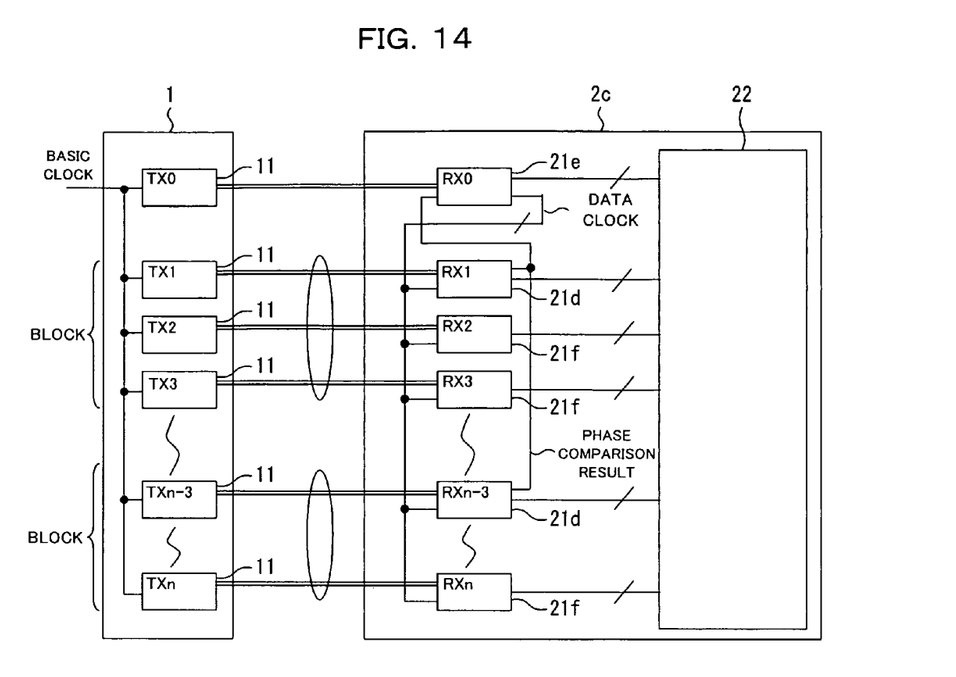
FIG. 14 is a block diagram showing an example of a configuration of an inter-chip transmission system according to a third embodiment.

FIG. 14 is a block diagram showing an example of a configuration of an inter-chip transmission system according to the present embodiment. In FIG. 14, the same reference numerals as those in FIG. 8 denote the same or corresponding parts as those in FIG. 8, and the descriptions thereof will be omitted here. Compared with FIG. 8, the inter-chip transmission system of FIG. 14 includes a receiving chip 2c (receiving apparatus) in place of the receiving chip 2b. Compared with the receiving chip 2b, the receiving chip 2c includes a receiving circuit 21e in place of the receiving circuit 21c and receiving circuits 21d and receiving circuits 21f in place of the receiving circuits 21d. The total number obtained by adding the number of the receiving circuits 21d and 21f is n. The n receiving circuits 21d and 21f are grouped into m blocks. Each block includes only one receiving circuit 21d. That is, the number of the receiving circuits 21d is m.

The receiving circuits 21d and 21f belonging to the same block have the same wiring length between themselves and corresponding transmitting circuits 11 of the transmitting chip 1. For example, it is assumed that one receiving circuit 21d is RXi, and that RXi+1 and RXi+2 which are two receiving circuits 21f belong to the same group as the RXi. Further, it is assumed, in the transmitting chip 1, that the transmitting circuits 11 connected respectively to the RXi, RXi+1, and RXi+2 is TXi, TXi+1, and TXi+2. In this case, the wiring between the TXi and RXi, wiring between the TXi+1 and RXi+1, and wiring between the TXi+2 and RXi+2 have the same length.

Figure 15:
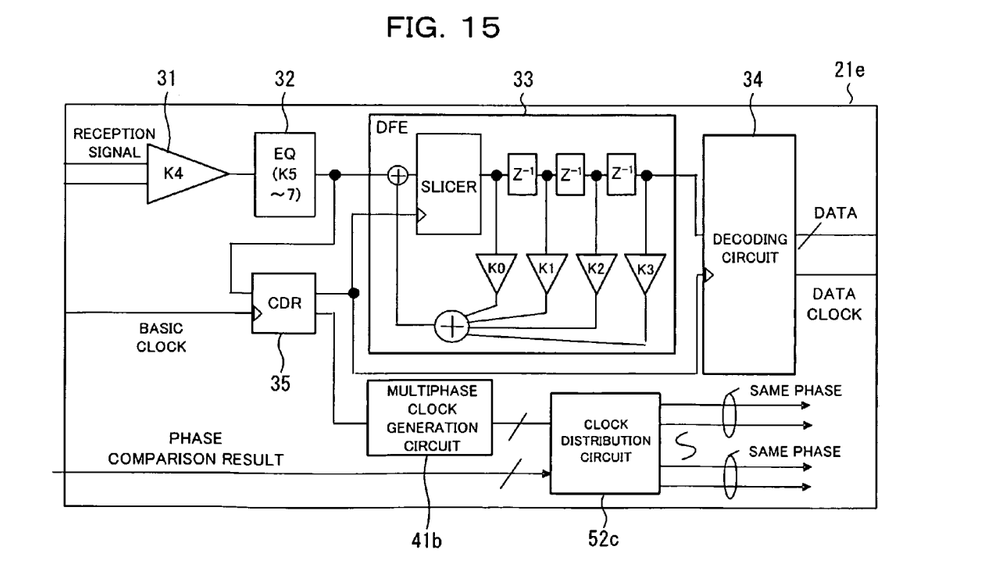
FIG. 15 is a block diagram showing an example of a configuration of a receiving circuit 21e according to the third embodiment.

FIG. 15 is a block diagram showing an example of a configuration of the receiving circuit 21e according to the present embodiment. In FIG. 15, the same reference numerals as those in FIG. 9 denote the same or corresponding parts as those in FIG. 9, and the descriptions thereof will be omitted here. Compared with the receiving circuit 21c, the receiving circuit 21e includes a clock distribution circuit 52c in place of the clock distribution circuit 52.

Assuming that one of the m blocks is a k-th block (k=1, 2, ..., m), the clock distribution circuit 52c selects, according to a phase comparison result input thereto from the receiving circuit 21d of the k-th block, one data block from p data clocks input thereto from the multiphase clock generation circuit 41b and supplies the selected data clock to the receiving circuits 21d and 21f belonging to the k-th block.

As in the case of the second embodiment, the phase comparison result indicates one of "advanced phase", "coincidence", and "delayed phase". In the case where the comparison result received from the receiving circuit 21*d* belonging to the k-th block is "advanced phase", the clock distribution circuit 52*c* supplies a data clock obtained by delaying the current data clock by half a clock cycle to the receiving circuits 21*d* and 21*f* belonging to the k-th block. In the case where the comparison result received from the receiving circuit 21*d* belonging to the k-th block is "delayed phase", the clock distribution circuit 52*c* supplies a data clock obtained by advancing the current data clock by half a clock cycle to the receiving circuits 21*d* and 21*f* belonging to the k-th block. In the case where the comparison result received from the receiving circuit 21*d* belonging to the k-th block is "coincidence", the clock distribution circuit 52*c* supplies the current data clock to the receiving circuits 21*d* and 21*f* belonging to the k-th block without modification.

The receiving circuit 21*d* according to the present embodiment has the same configuration as that of the receiving circuit 21*d* according to the second embodiment.

Figure 16:
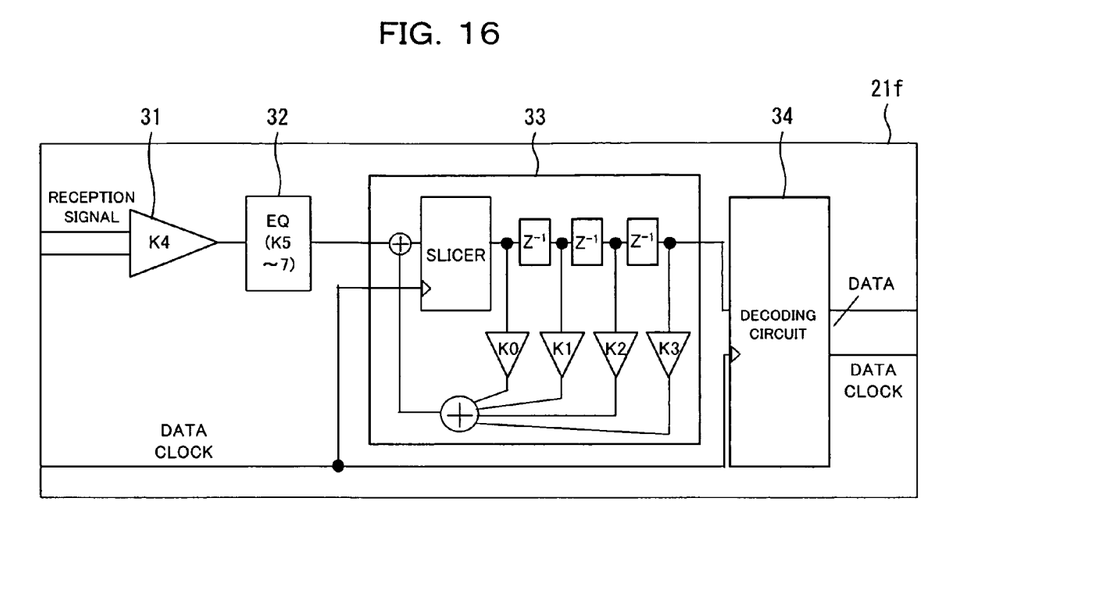
FIG. 16 is a block diagram showing an example of a configuration of a receiving circuit 21f according to the third embodiment.

FIG. 16 is a block diagram showing an example of a configuration of the receiving circuit 21*f* according to the present embodiment. In FIG. 16, the same reference numerals as those in FIG. 11 denote the same or corresponding parts as those in FIG. 11, and the descriptions thereof will be omitted here. Compared with the receiving circuit 21*d* of FIG. 11, the receiving circuit 21*f* of FIG. 16 does not require the phase comparison circuit 43.

Since the receiving circuits 21*d* and 21*f* belonging to the same block have the same wiring length between themselves and corresponding transmitting circuits 11, a clock controlled for the receiving circuit 21*d* in a given block can be used for the receiving circuit 21*f* belonging to the same block as the given block.

According to the present embodiment, the scale of the phase comparison circuit 43 provided in the receiving circuit 21*d* is smaller than that of the CDR 35*b* provided in the receiving circuit 21*e*. Further, the scale of the receiving circuit 21*f* is smaller than that of the receiving circuit 21*d*. It is only necessary for the receiving chip 2*a* to have only one receiving circuit 21*a* and have one receiving circuit 21*d* for each block, enabling high-quality data transmission while suppressing increase in the circuit scale of the receiving chip. As a result, it is possible to perform high-speed data transmission while suppressing power consumption of the receiving chip.

The present invention can be embodied in various forms, without departing from the spirit or the main feature. Therefore, the aforementioned embodiments are merely illustrative of the invention in every aspect, and not limitative of the same. The scope of the present invention is defined by the appended claims, and is not restricted by the description herein set forth. Further, various changes and modifications to be made within the scope of the appended claims and equivalents thereof are to fall within the scope of the present invention.

What is claimed is:

1. A receiving apparatus, comprising:
   a first receiving circuit connected with a first transmitting circuit through a first transmission line; and
   a second receiving circuit connected with a second transmitting circuit which is different from the first transmitting circuit through a second transmission line which is different from the first transmission line,
   wherein the first receiving circuit comprises:
      a Clock Data Recovery that generates a first clock based on a signal from the first transmission line;
      a first demodulation section that demodulates the signal from the first transmission line based on the timing of the first clock;
      a multiphase clock generation section that generates a plurality of multiphase clocks having phases different from phases of the first clock; and
      a clock distribution circuit that selects one clock from the plurality of the multiphase clocks generated by the multiphase clock generation section based on a phase controlling signal and outputs it to the second receiving circuit,
   wherein the second receiving circuit comprises
      a second demodulation section that demodulates a signal from the second transmission line based on the timing of the clock outputted by the clock distribution circuit, and
      a phase comparison section that compares a phase of the clock outputted by the clock distribution circuit with a phase of the signal from the second transmission line and outputs the comparison result as the phase controlling signal to the first receiving circuit.

2. The receiving apparatus according to claim 1, wherein the Clock Data Recovery is a Phase Locked Loop.

3. A receiving method for receiving apparatus; that includes a first receiving circuit connected with a first transmitting circuit through a first transmission line, and a second receiving circuit connected with a second transmitting circuit which is different from the first transmitting circuit through a second transmission line which is different from the first transmission line, the method comprising:
   generating a first clock based on a signal from the first transmission line;
   demodulating the signal from the first transmission line based on the timing of the first clock;
   generating a plurality of multiphase clocks having phases different from phases of the first clock;
   selecting one clock from the generated plurality of the multiphase clocks based on a phase controlling signal;
   outputting the selected clock to the second receiving circuit;
   demodulating a signal from the second transmission line based on the timing of the outputted selected clock;
   comparing a phase of the outputted selected clock with a phase of the signal from the second transmission line; and
   outputting the comparison result as the phase controlling signal to the first receiving circuit.

* * * * *